(12) United States Patent
Cheng et al.

(10) Patent No.: US 7,601,552 B2
(45) Date of Patent: Oct. 13, 2009

(54) SEMICONDUCTOR STRUCTURE OF LIQUID CRYSTAL DISPLAY AND MANUFACTURING METHOD THEREOF

(75) Inventors: Yi-Sheng Cheng, Hsin-Chu (TW); Ta-Wei Chiu, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 0 days.

(21) Appl. No.: 12/017,162

(22) Filed: Jan. 21, 2008

(65) Prior Publication Data
US 2008/0224142 A1 Sep. 18, 2008

(30) Foreign Application Priority Data
Mar. 14, 2007 (TW) .............................. 96108833 A

(51) Int. Cl.
*H01L 21/00* (2006.01)
(52) U.S. Cl. ................. 438/30; 438/149; 257/E21.094; 257/E21.104; 257/E21.121
(58) Field of Classification Search ............ 438/30, 438/149, 155, 241, 745, 151, 157, 283; 257/57, 257/59, 83, 257, 290, 368, 392, E21.094, 257/E21.104, E21.121
See application file for complete search history.

(56) References Cited

U.S. PATENT DOCUMENTS 5,279,989 A * 1/1994 Kim ........................... 438/396

| 6,566,172 | B1 | 5/2003 | Jackson et al. |
| 6,791,631 | B2 * | 9/2004 | Cheng et al. ................. 349/39 |
| 6,885,030 | B2 * | 4/2005 | Onozuka et al. .............. 257/66 |
| 7,279,370 | B2 | 10/2007 | Lim et al. |

FOREIGN PATENT DOCUMENTS

| CN | 1591137 | 3/2005 |
| CN | 1834790 | 9/2006 |

OTHER PUBLICATIONS

English language translation of abstract and pertinent parts of CN 1834790.
English language translation of abstract of CN 1591137.

* cited by examiner

*Primary Examiner*—Quoc D Hoang
(74) *Attorney, Agent, or Firm*—Thomas, Kayden, Horstemeyer & Risley

(57) ABSTRACT

A semiconductor structure of a liquid crystal display and the manufacturing method thereof are described. The manufacturing method includes the following steps. A patterned polysilicon layer and a first dielectric layer are formed on a substrate. A first patterned metal layer is formed to construct a gate electrode and a capacitor electrode. An ion implantation is conducted on the polysilicon layer to form drain and source electrodes. A second dielectric layer and a second patterned metal layer are formed thereon. Sequentially, a third dielectric layer is formed thereon. A plurality of via openings are formed by a patterned photoresist layer, and a third metal layer is formed thereon and filled into the via openings. The patterned photoresist layer and the redundant third metal layer are stripped from the substrate to form via plugs in the via openings. A patterned transparent conductive layer is formed thereon to connect the via plugs.

6 Claims, 2 Drawing Sheets

SEMICONDUCTOR STRUCTURE OF LIQUID CRYSTAL DISPLAY AND MANUFACTURING METHOD THEREOF

RELATED APPLICATIONS

This application claims priority to Taiwan Application Serial Number 96108833, filed Mar. 14, 2007, which is herein incorporated by reference.

BACKGROUND OF THE INVENTION

1. Field of Invention

The invention relates to a semiconductor structure and, in particular, to a semiconductor structure of a liquid crystal display (LCD).

2. Related Art

In recent years, there has been a lot of progress in optoelectronic techniques. The coming digital era also pushes the rapid development in the LCD market. The LCD's have the advantages of high quality, small volume, light weight, low driving voltage, and low power consumption. Therefore, they are widely used in personal digital assistants (PDA), mobile phones, video cameras, laptop computers, desktop displays, vehicle displays, and projective televisions. They have gradually replaced the traditional cathode ray tubes (CRT) and become the main stream of displays.

The LCD is a display device that uses the properties of liquid crystals to achieve the display effects. Since it is more flexible in the aspects of size and weight than the conventional CRT, it is often used in various personal systems. Such systems can be as small as mobile phones, PDA's, and digital cameras and as large as television and commercial advertisement boards.

The reason why the LCD is more flexible in the aspects of size and weight than the CRT is that most parts and devices of the LCD are flat. Therefore, LCDs can be cut into appropriate sizes according to the applications. They are also more compact than the CRTs.

In the LCD fabrication processes, photo masks with different patterns are used to define films of different patterns. However, it is well-known that photo masks are expensive. More photo masks cost more. Beside, the production time takes more. Therefore, it would benefit the fabrication cost reduction and the product competitive promotion if the number of required photo masks can be decreased.

SUMMARY OF THE INVENTION

In view of the foregoing, it is an objective of the invention to decrease the number of photo masks required in the manufacturing process, thereby reducing the production cost and increasing the production rate.

Another objective of the invention is to provide a method of manufacturing a semiconductor structure of a LCD panel that involves fewer photo masks.

A further objective of the invention is to chemically remove a photoresist layer and, at the same time, strip off the excessive part of the metal layer to form via plugs. This decreases the number of required photo masks.

Yet another objective of the invention is to use via plugs electrically connecting the source and drain of the thin-film transistor (TFT) and the storage capacitor and data line. A transparent conductive layer is connected to the surface of the via plugs to enhance the stability in electrical connection thereof.

According to the above-mentioned objectives, the disclosed method of manufacturing a semiconductor structure of a LCD has the following steps. First, a substrate defined with an active device region and a capacitor region is provided. A polysilicon layer is formed and patterned in the active device region and the capacitor region of the substrate. A first dielectric layer is formed thereon. A first metal layer is then formed and patterned on the first dielectric layer, covering the polysilicon layer part of the active device region to construct a gate. It covers the polysilicon layer in the capacitor region to construct a first capacitor electrode.

The first metal layer is used as a mask. An ion implantation, such as a N+ implantation or a P+ implantation, is performed for the uncovered polysilicon layer to form a first source/drain and a second source/drain. Afterwards, a second dielectric layer is deposited thereon and subsequently a second metal layer is formed and patterned thereon to form at least a data line around the active device region and a second capacitor electrode in the capacitor region.

A third dielectric layer is formed on the second metal layer and the substrate. Afterwards, a patterned photoresist layer is formed as a mask for etching the third dielectric layer, the second dielectric layer, and the first dielectric layer. A plurality of via openings are thus formed to expose the data line, the first source/drain, the second source/drain, and the second capacitor electrode after an etching process. Afterwards, a third metal layer is formed to cover the patterned photoresist layer and to fill the via openings. The patterned photoresist layer and part of the third metal layer on the patterned photoresist layer are then stripped off to form a plurality of via plugs. The stripping process is preferably done by using a chemical solution, such as acetone.

Afterwards, a patterned transparent conductive layer is formed to electrically connect the data line and the first source/drain by the via plugs.

The disclosed semiconductor structure of an LCD and the manufacturing method thereof utilize a chemical stripping process to remove the photoresist layer and the excessive conductive layer on the photoresist layer. The via plugs are directly formed in the via openings. A transparent conductive layer is used to electrically connect the source/drain of the TFT, the data line, and the capacitor electrode by the via plugs. This does not only involve one less photo mask, effectively reducing the LCD production cost, the transparent conductive layer can be directly connected to the stripping surface above the plugs without going deep into the via openings. The stability in electrical connection can be thus enhanced.

BRIEF DESCRIPTION OF THE DRAWINGS

These and other features, aspects and advantages of the invention will become apparent by reference to the following description and accompanying drawings which are given by way of illustration only, and thus are not limitative of the invention, and wherein.

DETAILED DESCRIPTION OF THE INVENTION

Figure 1A:
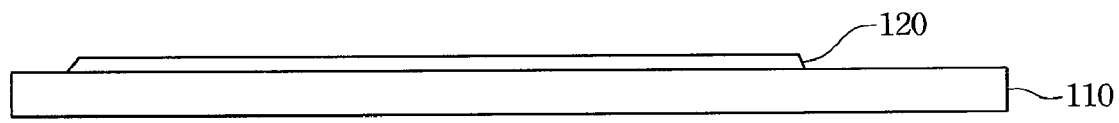
FIGS. 1A to 1F are schematic views of a manufacturing method of a semiconductor structure for an LCD panel according to the invention.
Figure 1B:
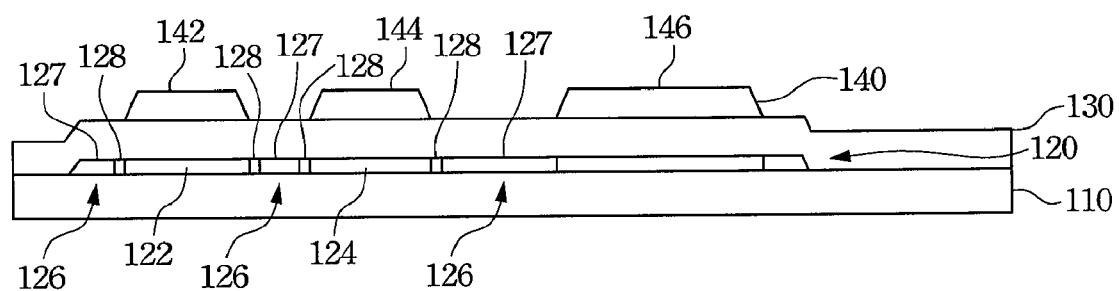

According to the invention, the excessive part of the metal layer for forming the via plugs can be removed at the same time when the photoresist layer is chemically stripped. This method does not only decrease the required number of photo masks, but also uses the via plugs to connect the drain and source of the TFT and the storage capacitor and the data line.

The transparent electrode can connect with the above-mentioned devices through the via plugs, greatly improve the electrical connection quality between the transparent conductive layer and the devices. The present invention will be apparent from the following detailed description, which proceeds with reference to the accompanying drawings, wherein the same references relate to the same elements.

FIGS. 1A to 1F are schematic views showing steps in the disclosed method of manufacturing a semiconductor structure of an LCD panel. According to this embodiment, a substrate 110, such as a glass substrate or a quartz substrate, is formed with a patterned polysilicon layer 120. The polysilicon layer 120 is formed by depositing a polysilicon layer on the substrate 110, and then patterned by a photolithographic technique to render a desired pattern. Afterwards, a dielectric layer 130 covers the patterned polysilicon layer 120 and the substrate 110. A metal layer 140 is then formed and patterned on the dielectric layer 130. This embodiment uses a dual gate as an example to explain the structure. The patterned metal layer 140 is used to construct a first gate electrode 142 and a second gate electrode 144 in an active device region and to construct a first capacitor electrode 146 in a capacitor region. The first gate electrode 142, the second gate electrode 144, and the first capacitor electrode 146 partially cover the patterned polysilicon layer 120. The patterned metal layer 140 is used as a mask for an ion implantation in the polysilicon layer 120, forming an ion implanted region 126. In particular, the shape of the patterned metal layer 140 can be varied to form a heavily implanted region 127, such as a P+ type ion implanted region, in the uncovered part of the metal layer 140. A lightly implanted region 128 is formed beside the heavily implanted region 127 and below the first metal layer adjacent to the heavily implanted region, i.e. at the interface between the metal layer 140 and heavily implanted region 127. The slope around the patterned metal layer 140 can be adjusted to lower the ion implantation concentration, thus forming the lightly implanted region 128.

Besides, the ion implantation can involve two ion implantation processes with different concentrations in order to form the heavily implanted region 127 and the lightly implanted region 128. For example, a patterned metal layer 140 covering a larger area is used to perform the ion implantation for the heavily implanted region 127. Then the patterned metal layer 140 is shrunken to cover a smaller area for the ion implantation of the lightly implanted region 128. The yet implanted polysilicon layer 120 is formed with a first channel region 122 and a second channel region 124, respectively.

Figure 1C:
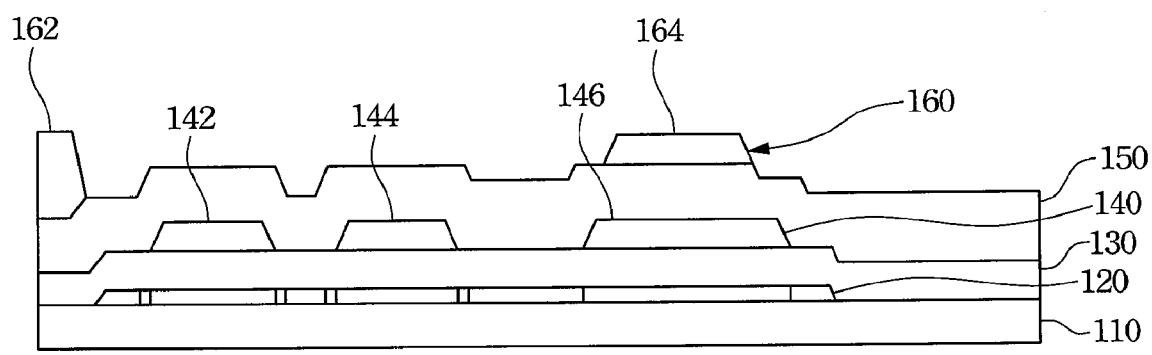
Figure 1D:
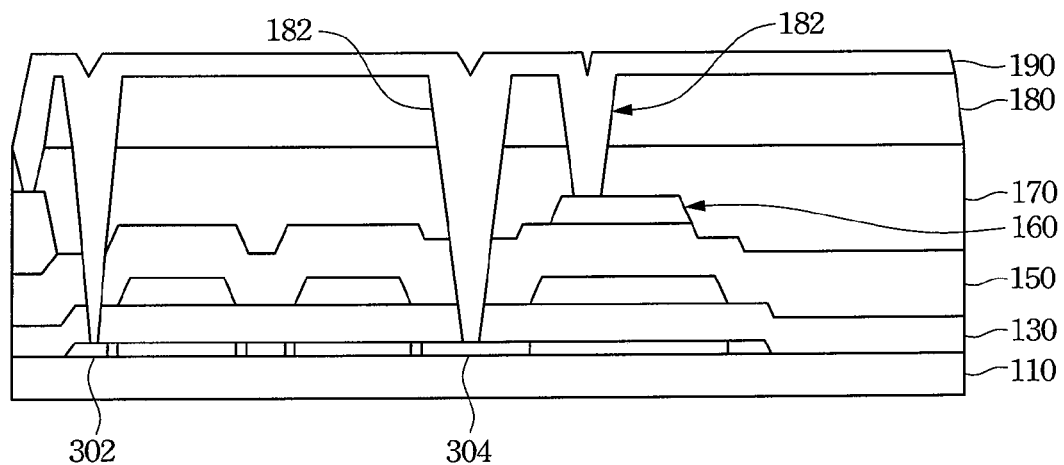

With reference to FIG. 1C, a dielectric layer 150 is formed thereon. A metal layer 160 is then formed on the dielectric layer 150, followed by a patterning process to form the data line 162 and the second capacitor electrode 164 in the capacitor region. With reference to FIG. 1D, another dielectric layer 170 is formed thereon, followed by coating a photoresist layer 180. The photoresist 180 is patterned to form a plurality of via openings 182 therein, exposing the first source/drain 302, the second source/drain 304 (corresponding to the heavily implanted region 127 on both sides of the first gate electrode 142 and the second gate electrode 144), the data line 162, and the second capacitor electrode 164. Afterwards, a conductive layer 190 is formed on the photoresist layer 180 and fills the via openings 182. A material of the conductive layer 190 can be titanium (Ti), aluminum (Al), tungsten (W), molybdenum (Mo), or their alloys.

Figure 1E:
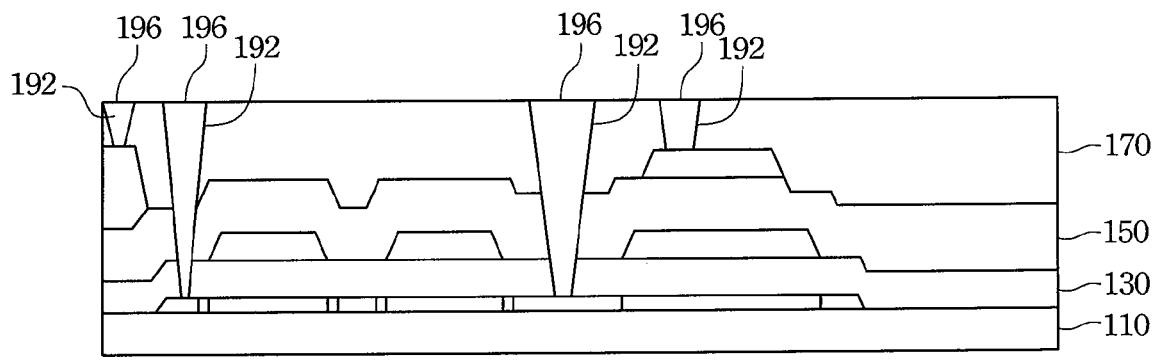

A chemical stripping process is employed to strip off the photoresist layer 180 and part of the conductive layer 190 to form the via plugs 192 shown in FIG. 1E. Due to the chemical stripping process, the via plug 192 is formed with a stripping surface 196. The height of the stripping surface 196 is about the same as the dielectric layer 170.

Figure 1F:
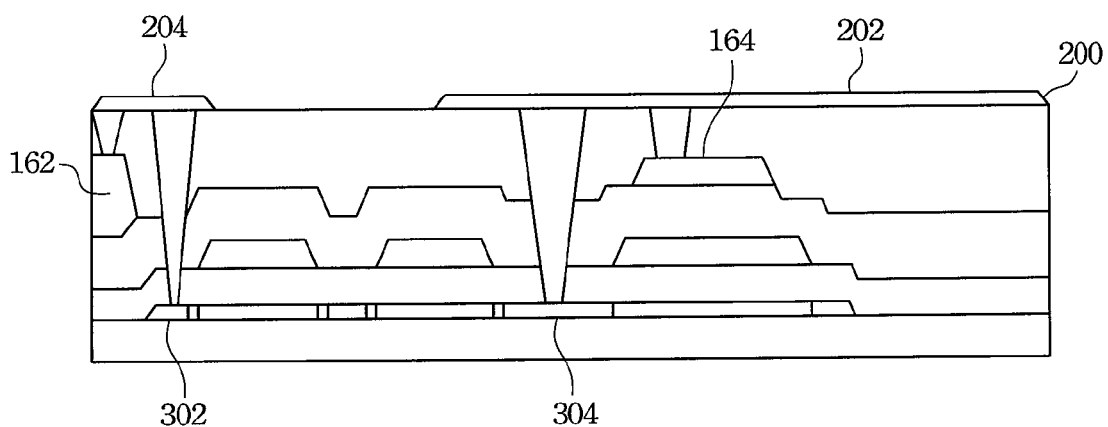

With reference to FIG. 1F, a transparent conductive layer 200, such as an indium tin oxide (ITO) or indium zinc oxide (IZO) film, is formed and patterned to form a transparent wire 204 connecting to the data line 162 and the first source/drain 302 in the active device region by the via plugs 192 thereon, and to form a pixel electrode 202 connecting to the second source/drain 304 in the active device region and the second capacitor electrode 164 in the capacitor region by the via plugs 192 thereon.

Since the invention employs a chemical stripping process to directly strip off the photoresist layer 180 and the excessive conductive layer 190, the via plugs 192 can be directly formed in the via openings 182. Moreover, the transparent conductive layer connects to the source/drain of the TFT, the data line, and the capacitor electrode by the via plugs. The invention effectively saves one photo mask and reduces the production cost of the LCD. Since the transparent conductive layer can be directly connected to the stripping surface on the plugs without entering deep into the via openings, the stability of electrical connection can be enhanced. The above-mentioned TFT is preferably a low temperature polysilicon thin film transistor (LTPS TFT).

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

While the invention has been described by way of example and in terms of the preferred embodiment, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of manufacturing a semiconductor structure of a liquid crystal display (LCD) panel, comprising the steps of:
   providing a substrate defined with an active device region and a capacitor region;
   forming and patterning a polysilicon layer in the active device region and the capacitor region of the substrate;
   forming a first dielectric layer to cover the polysilicon layer and the substrate;
   forming and patterning a first metal layer on the first dielectric layer, wherein the first metal layer covers part of the polysilicon layer in the active device region to compose a gate electrode and covers the polysilicon layer in the capacitor region to compose a first capacitor electrode;
   forming a heavily implanted region in the polysilicon layer not covered by the first metal layer in the active device region as a first source/drain and a second source/drain;
   forming a second dielectric layer to cover the first metal layer and the substrate;
   forming and patterning a second metal layer to form a data line around the active device region and a second capacitor electrode in the capacitor region;
   forming a third dielectric layer to cover the second metal layer and the substrate;
   forming a patterned photoresist layer;
   etching the third dielectric layer, the second dielectric layer, and the first dielectric layer to form a plurality of via openings exposing the data line, the first source/ drain, the second source/drain, and the second capacitor electrode by using the patterned photoresist layer as a mask;

forming a third metal layer to cover the patterned photoresist layer and the substrate and to fill the via openings;

stripping off the patterned photoresist layer and part of the third metal layer on the patterned photoresist layer; and forming and patterning a transparent conductive layer to form a transparent wire and a pixel electrode, wherein the transparent wire electrically connects the data line and the first source/drain and the pixel electrode electrically connects the second source/drain and the second capacitor electrode.

2. A method of manufacturing a semiconductor structure of an LCD panel as in claim 1 further comprising the step of forming a lightly implanted region beside the heavily implanted region by using a second ion implantation.

3. A method of manufacturing a semiconductor structure of an LCD panel as in claim 1 further comprising the step of forming a lightly implanted region below the first metal layer adjacent to the heavily implanted region.

4. A method of manufacturing a semiconductor structure of an LCD panel as in claim 1, wherein the heavily implanted region is a P+ type ion implanted region.

5. A method of manufacturing a semiconductor structure of an LCD panel as in claim 1, wherein the step of stripping off the patterned photoresist layer and part of the third metal layer on the patterned photoresist layer is performed by using a chemical solution.

6. A method of manufacturing a semiconductor structure of an LCD panel as in claim 5, wherein the chemical solution includes acetone.

* * * * *